United States Patent
Ramvall

(10) Patent No.: US 10,312,077 B2
(45) Date of Patent: Jun. 4, 2019

(54) METHOD FOR FORMING ALUMINUM-CONTAINING DIELECTRIC LAYER

(71) Applicant: Taiwan Semiconductor Manufacturing Company, Ltd., Hsin-Chu (TW)

(72) Inventor: Peter Ramvall, Hsinchu (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 646 days.

(21) Appl. No.: 14/878,016

(22) Filed: Oct. 8, 2015

(65) Prior Publication Data
US 2017/0103883 A1    Apr. 13, 2017

(51) Int. Cl.
H01L 21/02    (2006.01)
C23C 16/40    (2006.01)
C23C 16/455   (2006.01)

(52) U.S. Cl.
CPC .......... *H01L 21/0228* (2013.01); *C23C 16/40* (2013.01); *C23C 16/45531* (2013.01); *H01L 21/02178* (2013.01); *H01L 21/02205* (2013.01)

(58) Field of Classification Search
CPC ....................................................... H01L 21/02
See application file for complete search history.

(56) References Cited

U.S. PATENT DOCUMENTS

| | | | |
|---|---|---|---|
| 8,487,378 B2 | 7/2013 | Goto et al. | |
| 8,729,634 B2 | 5/2014 | Shen et al. | |
| 8,826,213 B1 | 9/2014 | Ho et al. | |
| 8,887,106 B2 | 11/2014 | Ho et al. | |
| 2014/0264224 A1* | 9/2014 | Zhang | H01L 45/144 257/2 |
| 2014/0282326 A1 | 9/2014 | Chen et al. | |

* cited by examiner

*Primary Examiner* — Marvin Payen
(74) *Attorney, Agent, or Firm* — Haynes and Boone, LLP

(57) ABSTRACT

The present disclosure provides a method of forming an aluminum-containing layer. The method includes providing a substrate in an atomic layer deposition (ALD) process chamber; and performing a cycle of a first step and a second step one or more times in the ALD process chamber to provide a composite layer, wherein performing the first step of the cycle includes: applying a first precursor that includes a non-aluminum-based component having a first molecular weight onto the substrate; and applying a second precursor that that includes an aluminum-based component having a second molecular weight onto the substrate, wherein the second molecular weight is lower than the first molecular weight; and wherein performing the second step of the cycle includes applying the first precursor onto the substrate.

20 Claims, 9 Drawing Sheets

METHOD FOR FORMING ALUMINUM-CONTAINING DIELECTRIC LAYER

BACKGROUND

In semiconductor technology, higher-k materials such as $ZrO_2$ and $HfO_2$ are being implemented in order to achieve lower effective oxide thickness without compromising the ability to prevent dopant migration between the gate and channel region. A gate dielectric layer consisting of a high-k dielectric film with a thickness of less than 20 angstroms is difficult to control by a CVD technique which usually has a relatively fast deposition rate. Accordingly, atomic layer deposition (ALD) has been proposed to provide a more controllable deposition rate.

While a variety of techniques to use ALD to form a film have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
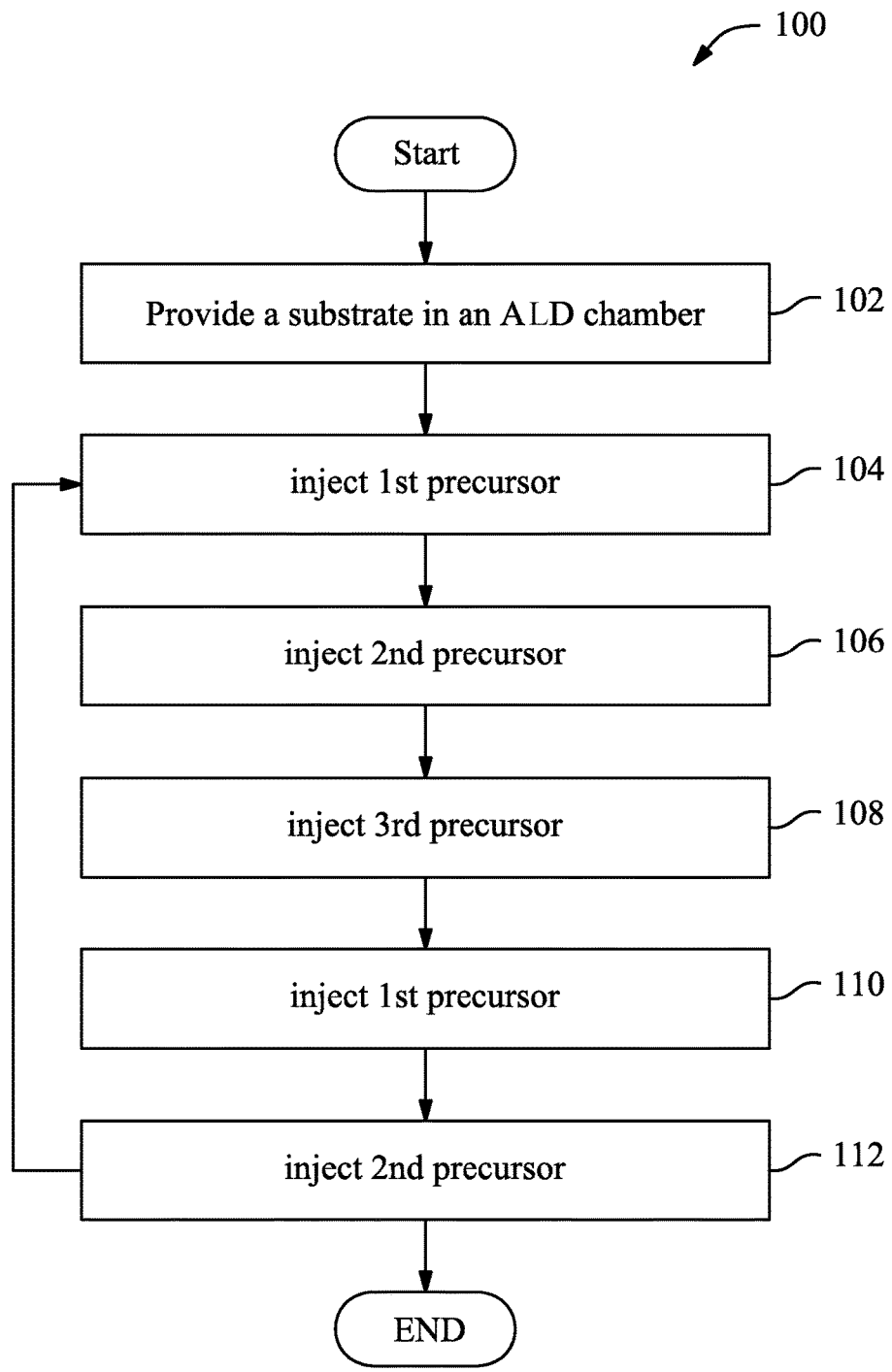
FIG. 1 is a flowchart of one embodiment of a method to form an aluminum-containing film in accordance with some embodiments.

It is to be understood that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

A variety of high dielectric constant dielectric materials (high-k dielectric) have been investigated as possible replacements for silicon dioxide. Potential candidates of such high-k dielectric materials include titanium oxide ($TiO_2$), tantalum oxide ($Ta_2O_5$, k value between 9 and 27), aluminum oxide ($Al_2O_3$, k value about 9), zirconium oxide ($ZrO_2$, k value between 10 and 25), hafnium oxide ($HfO_2$, k value between 10 and 25), and various combinations and mixtures such as multilayers, multicomponents, and nanolaminates. Moreover, incorporating a trivalent metal such as aluminum (Al) into a high dielectric constant material such as zirconium oxide ($ZrO_2$) or hafnium oxide ($HfO_2$) advantageously increases the crystallized temperature so that the resulting film remains amorphous under high temperature processing conditions. However, in order to form a film with a percentage of the trivalent metal at about 50% or less, it generally requires forming a composite layer that includes plural non-trivalent metal-containing layers (e.g., $HfO_2$) and trivalent metal layers (e.g., $Al_2O_3$). In an example, multiple non-trivalent metal-containing layers (e.g., more than 9 layers of $HfO_2$) may be required to average down the high percentage of the aluminum in the trivalent metal-containing layer (e.g., 90% or more in the $Al_2O_3$ layer) in order to form a composite layer with about 5% ratio of aluminum atom, which in turn results in a relative thick composite layer (e.g., 2 nanometers or more). The present disclosure provides methods of forming an aluminum-containing composite high-k dielectric material layer with a substantially thin thickness (e.g., about 2 angstroms) while keeping the percentage of aluminum low (e.g., about 5% atomic ratio of aluminum or less).

FIG. 1 is a flowchart of a method 100 to form a composite film according to one or more embodiments of the present invention. FIGS. 2A, 2B, 2C, 2D, 2E, 2F, and 2G illustrate sectional views of an exemplary composite film 200 during various fabrication stages of the method 100. With reference to FIG. 1 through FIG. 2G and other figures, the method 100 and the exemplary composite film 200 are described below.

Figure 2A:
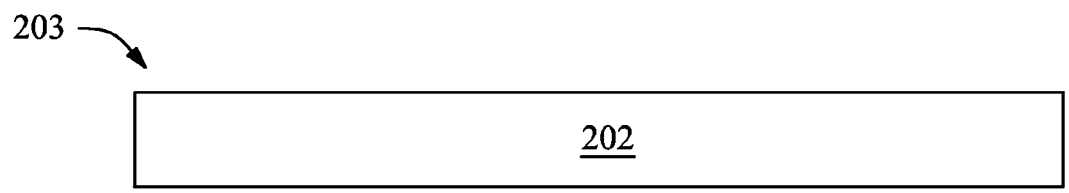
FIGS. 2A, 2B, 2C, 2D, 2E, 2F, and 2G illustrate sectional views of an exemplary aluminum-containing film during various fabrication stages, made by the method of FIG. 1, constructed in accordance with some embodiments.

The method 100 begins at 102 by providing or receiving a substrate 202 in an atomic layer deposition chamber that includes a top surface 203 as illustrated in FIG. 2A. In some embodiments, the substrate 202 includes silicon. Alternatively, the substrate 202 may include other elementary semiconductor such as germanium in accordance with some embodiments. In some embodiments, the substrate 202 additionally or alternatively includes a compound semiconductor such as silicon carbide, gallium arsenic, indium arsenide, and indium phosphide. In some embodiments, the substrate 202 includes an alloy semiconductor such as silicon germanium, silicon germanium carbide, gallium arsenic phosphide, and gallium indium phosphide.

The substrate 202 may include an epitaxial layer formed on the top surface, such as an epitaxial semiconductor layer overlying a bulk semiconductor wafer. In some embodiments, the substrate 202 includes a semiconductor-on-insulator (SOI) structure. For example, the substrate may include a buried oxide (BOX) layer formed by a process such as separation by implanted oxygen (SIMOX). In various embodiments, the substrate 202 includes various p-type doped regions and/or n-type doped regions, such as p-type wells, n-type wells, p-type source/drain features and/or n-type source/drain features, formed by a process such as ion implantation and/or diffusion. The substrate 202 may include other functional features such as a resistor, a capacitor, diode, transistors, such as field effect transistors (FETs). The substrate 202 may include lateral isolation features configured to separate various devices formed on the substrate 202. The substrate 202 may further include a portion of a multilayer interconnection (MLI) structure. The multilayer interconnection structure includes metal lines in a plurality of metal layers. In the current embodiment, the substrate 202 may include an active channel region of a transistor. As such, a subsequently formed layer/film on the substrate/top surface 203 may be a gate dielectric layer.

Figure 2B:
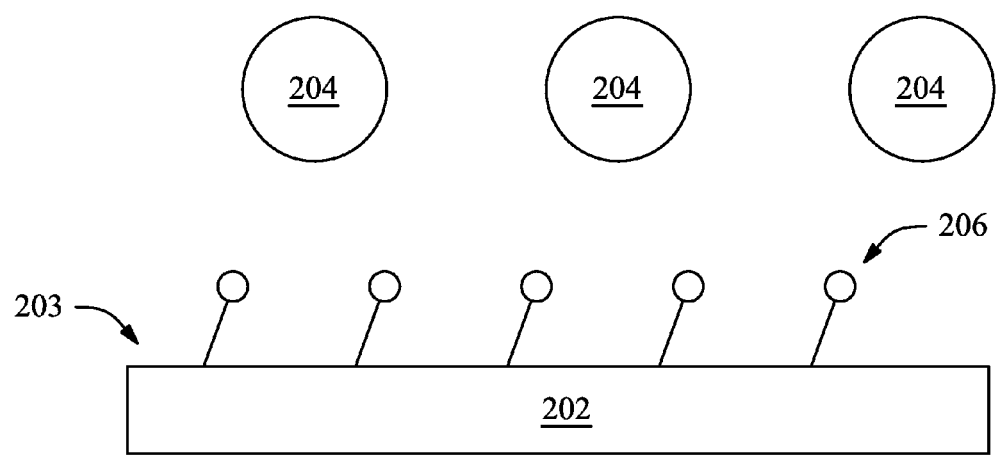

The method 100 proceeds to operation 104 by applying/injecting a first precursor 204 into the chamber thereby forming a hydrogen-terminated surface 203 as illustrated in FIG. 2B. In the illustrated embodiment of FIG. 2B, such a hydrogen-terminated surface 203 may be implemented by injecting an oxygen-based precursor (e.g., $H_2O$) into the chamber and accordingly the surface 203 may be covered by a plurality of hydroxyl groups 206. However, any of a variety of oxygen-based precursors may be used to form such a hydrogen-terminated surface while remaining within the scope of the present disclosure. Typically, before the injection of the oxygen-based precursor into the chamber, the chamber and/or the substrate 202 has been maintained at an elevated temperature, for example, about 80° C. to about 150° C. and the chamber has a pressure that ranges from about 0.1 mbar to about 2 mbar. In some embodiments, this elevated temperature and pressure range are maintained throughout subsequent operations (e.g., up to operation 112). The injection of the oxygen-based precursor into the chamber may last for a short interval (e.g., about 0.1 seconds to about 0.5 seconds) and is followed by a purge with an inert gas such as, for example, Ar, He, and/or $H_2$. This purging process purges any excessive or unreacted first precursor(s).

Figure 2C:
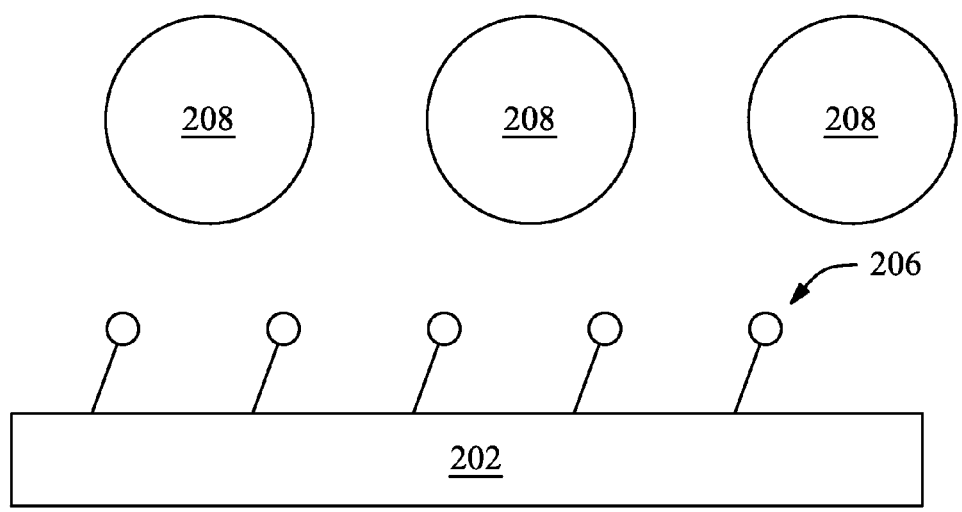

The method 100 proceeds to operation 106 by applying/injecting a second precursor 208 into the chamber as illustrated in FIG. 2C. In some embodiments, the second precursor 208 may include TetrakisDiMethylAminoHafnium (TDMAHf) with a molecular weight of about 355 Daltons and/or TetrakisEthylMethylAmidoZirconium(TEMAZr) with a molecular weight about 324 Daltons. In other embodiments, the second precursor 208 may include TetrakisDiMethylAminoHafnium(TDMAHf) with a molecular weight ranging from about 300 Daltons to about 400 Daltons and/or TetrakisEthylMethylAmidoZirconium(TEMAZr) with a molecular weight from about 300 Daltons to about 400 Daltons.

Figure 2D:
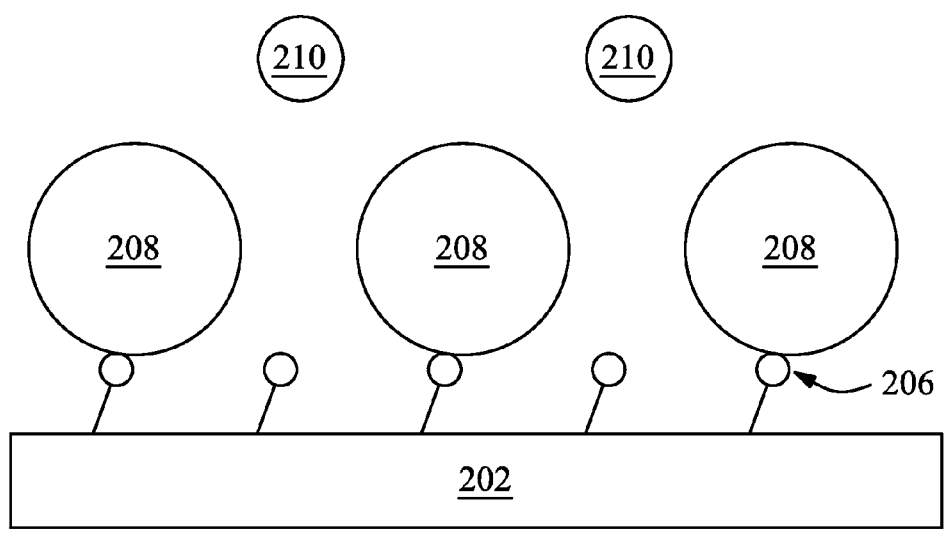

While the substrate/chamber is maintained at the above-mentioned elevated temperature and pressure, the injection of the second precursor 208 may include flowing the second precursor into the chamber with a flow rate of about 100 to about 300 standard cubic centimeters per minute (sccm) for a short interval (e.g., about 0.1 seconds to about 2 seconds). As such, the second precursor 208, at least in part, may react and combine with the hydroxyl group 206 on the substrate 202 (as illustrated in FIG. 2D). Following the injection of the second precursor 208 into the chamber, an inert gas such as, for example, Ar, He, and/or $H_2$ may be injected into the chamber. This purging process purges any excessive or unreacted second precursor(s).

Referring to FIGS. 1 and 2D, method 100 includes an operation 108 by applying/injecting a third precursor 210 into the chamber. In some embodiments, the third precursor 210 may include TriMethylAluminium(TMAl) with a molecular weight about 70 Daltons. In other embodiments, the third precursor 210 may include TriMethylAluminium (TMAl) with a molecular weight ranging from about 30 Daltons to about 150 Daltons. In the example in which the second precursor 208 has a molecular weight ranging between about 300 Daltons to about 400 Daltons and the third precursor 210 has a molecular weight ranging between about 30 Daltons to about 150 Daltons, a substantial difference of the molecular weights between the second and the third precursors may range between about 50% to about 93%.

Figure 2E:
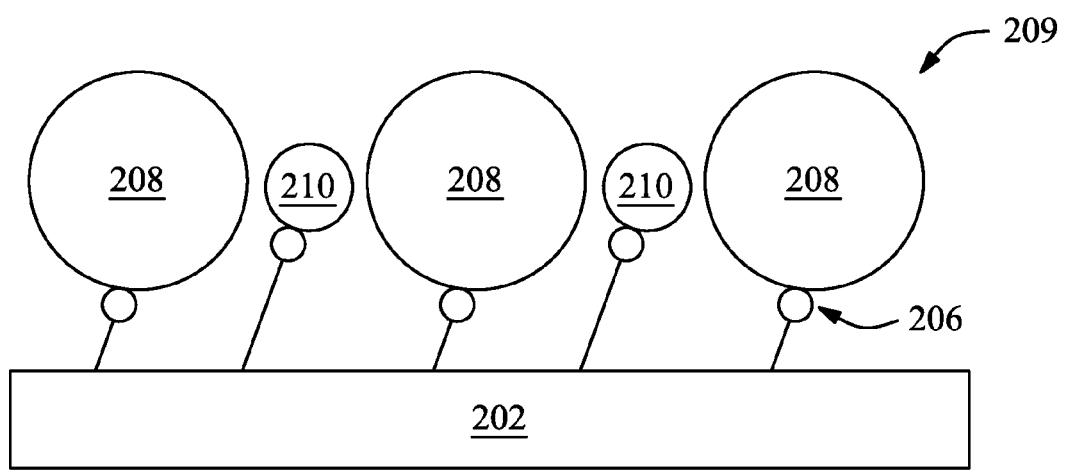

Such a third precursor may be an aluminum-containing precursor. For example, the third precursor may be an aluminum-containing precursor selected from the group consisting of aluminum chloride, aluminum iodide, etc. While the substrate/chamber is maintained at the above-mentioned elevated temperature and pressure, the injection of the third precursor 210 may include flowing the third precursor into the chamber with a flow rate of about 50 to about 300 standard cubic centimeters per minute (sccm) for a short interval (e.g., about 0.1 seconds to about 0.5 seconds). As such, the third precursor 210, at least in part, may react and combine with a remaining portion of hydroxyl groups 206 that do not react/combine with the second precursor 208 on the substrate 202 (as illustrated in FIG. 2E). Following the injection of the third precursor 210 into the chamber, an inert gas such as, for example, Ar, He, and/or $H_2$ may be injected into the chamber so to purge any excessive or unreacted third precursor(s).

Referring still to FIG. 2E, after the second precursor 208 and the third precursor 210 react/combine with the hydroxyl groups 206, a layer 209 is formed on the substrate 202. More particularly, due to the fact of a substantial difference of the molecular weights and physical sizes between the second precursor 208 and the third precursor 210, a first portion of the hydroxyl groups 206 may react/combine with the second precursors 208 and a second portion of the hydroxyl groups 206 may react/combine with the third precursors 210 (aluminum-containing precursor). The formed layer 209 consists of precursor 208 and 210 at a ratio of 2/1 resulting in a total atomic percentage/ratio (or concentration) of aluminum in the dielectric layer at about 10%. In some embodiments, the layer 209 may have a thickness that is about 1 angstrom.

Figure 2F:
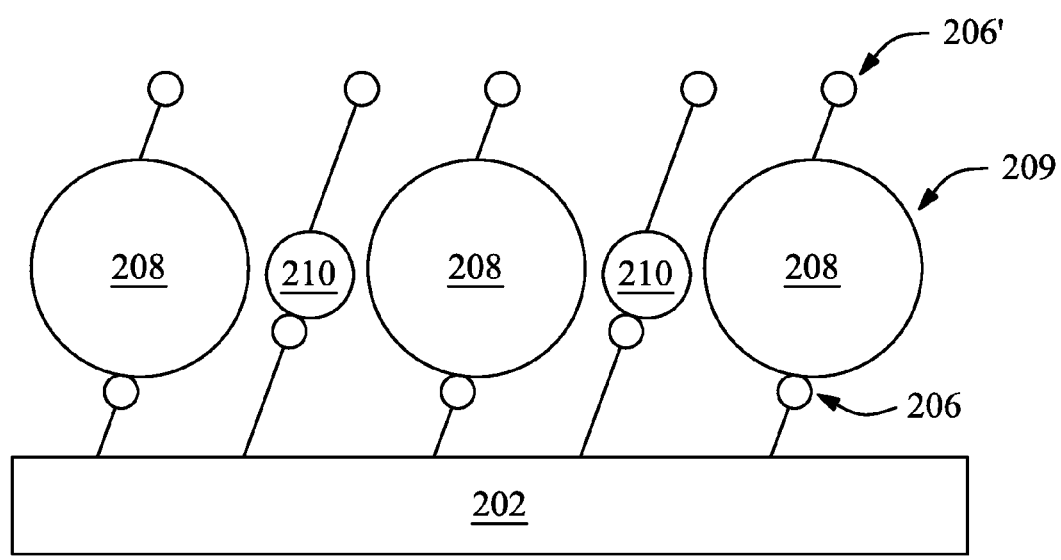
Figure 2G:
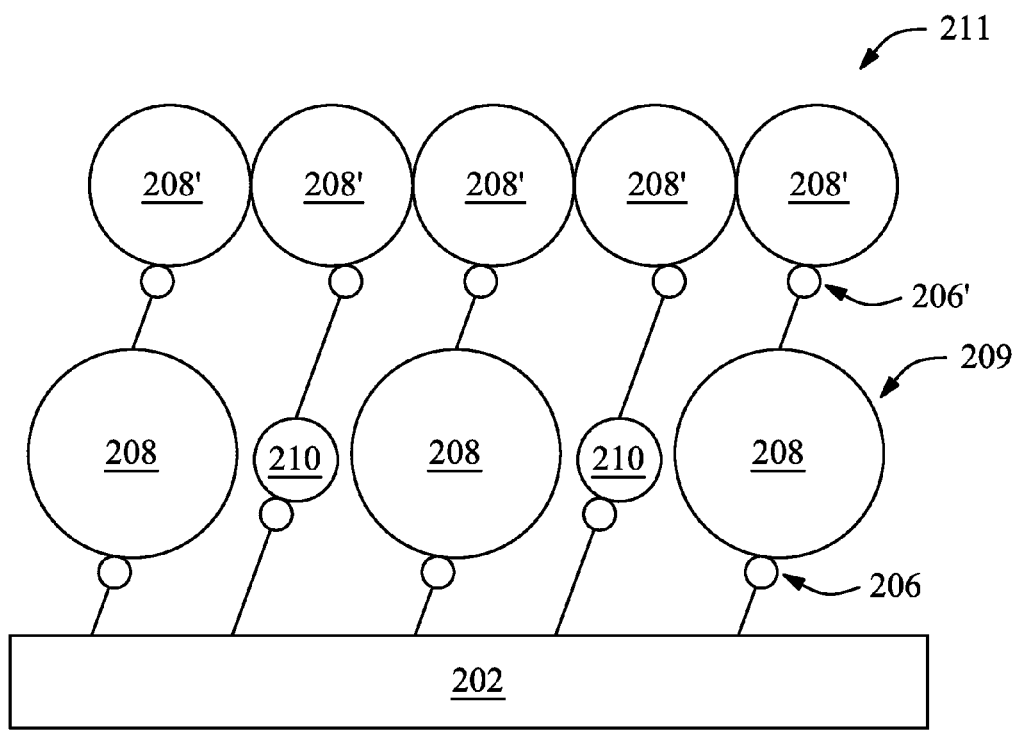

The method 100 then proceeds to operation 110 by applying/injecting the first precursor 204 into the chamber thereby causing the layer 209 to be covered by another plurality of hydroxyl groups 206' as illustrated in FIG. 2F. As shown, hydroxyl groups 206' are disposed over layer 209 and bond with the second and third precursor materials 208 and 210 that are already bonded with hydroxyl groups 206. Following the injection of the first precursor 204 into the chamber, an inert gas such as, for example, Ar, He, and/or $H_2$ may be injected into the chamber so to purge any excessive or unreacted first precursor(s).

The method 100 continues to operation 112 with applying/injecting the second precursor 208' into the chamber thereby forming a layer 211 over the layer 209 as illustrated in FIG. 2G. In some embodiments, the second precursor 208' may include TetrakisDiMethylAminoHafnium(TDMAHf) with a molecular weight of about 355 Daltons and/or TetrakisEthylMethylAmidoZirconium(TEMAZr) with a molecular weight about 324 Daltons. In other embodiments, the second precursor 208' may include TetrakisDiMethylAminoHafnium(TDMAHf) with a molecular weight ranging from about 300 Daltons to about 400 Daltons and/or TetrakisEthylMethylAmidoZirconium(TEMAZr) with a molecular weight from about 300 Daltons to about 400 Daltons. In some embodiments, the second precursor 208' is formed of the same material as the second precursor 208. Alternatively, in other embodiments, the second precursor 208' is formed of a different material than second precursor 208.

While the substrate/chamber is maintained at the above-mentioned elevated temperature and pressure, the injection of the second precursor 208 at operation 112 may include flowing the second precursor 208' into the chamber with a flow rate of about 100 to about 300 standard cubic centimeters per minute (sccm) for a short interval (e.g., about 0.1 seconds to about 2 seconds). As such, the second precursor 208', at least in part, may react and combine with the hydroxyl group 206' (as illustrated in FIG. 2G) and thus the layer 211 (a non-aluminum-containing layer) is formed. Thus, the formed layer 211 may include a percentage of aluminum that is about 0%. In some embodiments, the layer 211 may have a thickness that is about 1 angstrom. Following the injection of the second precursor 208' into the chamber, an inert gas such as, for example, Ar, He, and/or $H_2$ may be injected into the chamber so to purge any excessive or unreacted second precursor(s).

After operation 112, method 100 may continue with an annealing step. Such an annealing step may be performed to improve the quality of the formed layers 209/211 and in turn form a composite layer that includes the layers 209 and 211. In some embodiments, such an annealing step may include heating up the substrate 202 and the formed layers 209 and 211 in nitrogen to an elevated temperature (e.g., about 250° C.) for about 30 seconds.

Referring to FIG. 1, after the operation 112, method 100 may route back to operation 104 for one or more cycles. By "cycle", in the current embodiments, it is meant that a series of operations from 104 to 112 is sequentially performed. In some embodiments, any number of cycles may be performed until a desired thickness of a composite layer is reached. For example, in the illustrated embodiment of FIG. 2G, one cycle is performed. That is, an aluminum-containing dielectric layer 209 (about 10% atomic ratio of aluminum, 1 angstrom) and a non-aluminum-containing layer 211 (0% aluminum, 1 angstrom) are formed, which results in a composite layer that has an aluminum percentage of about 5% atomic ratio with a total thickness of about 2 angstrom. If a desired thickness of a composite layer is about 4 angstrom and with an aluminum percentage of about 5% atomic ratio, 2 cycles may be performed to reach such a goal.

The method 100 illustrated in FIG. 1 is merely an example, one or more operations in the method 100 may be added, omitted, or exchanged for a suitable use and while remaining within the scope of the present disclosure. In an example, if a desired thickness of a composite layer is about 4 angstrom and with an aluminum percentage of about 2% to 3% atomic ratio, the composite layer may include one aluminum-containing layer and three non-aluminum-containing layers. In order to form such a composite layer, an aluminum-containing layer may be formed first and followed/covered by a non-aluminum-containing layer by using one cycle (operations 104-112), and subsequently by performing 3 iterations of operations from 110 to 112. In another example, if a desired thickness of a composite layer is about 10 angstrom and with an aluminum percentage of about 5% atomic ratio, the composite layer may include five aluminum-containing layers and five non-aluminum-containing layers. In order to form such a composite layer, an aluminum-containing layer may be formed first and followed/covered by a non-aluminum-containing layer by using one cycle (operations 104-112), and subsequently by performing 4 iterations of operations from 104 to 112 to form other four aluminum-containing layers/non-aluminum-containing layers.

Figure 3:
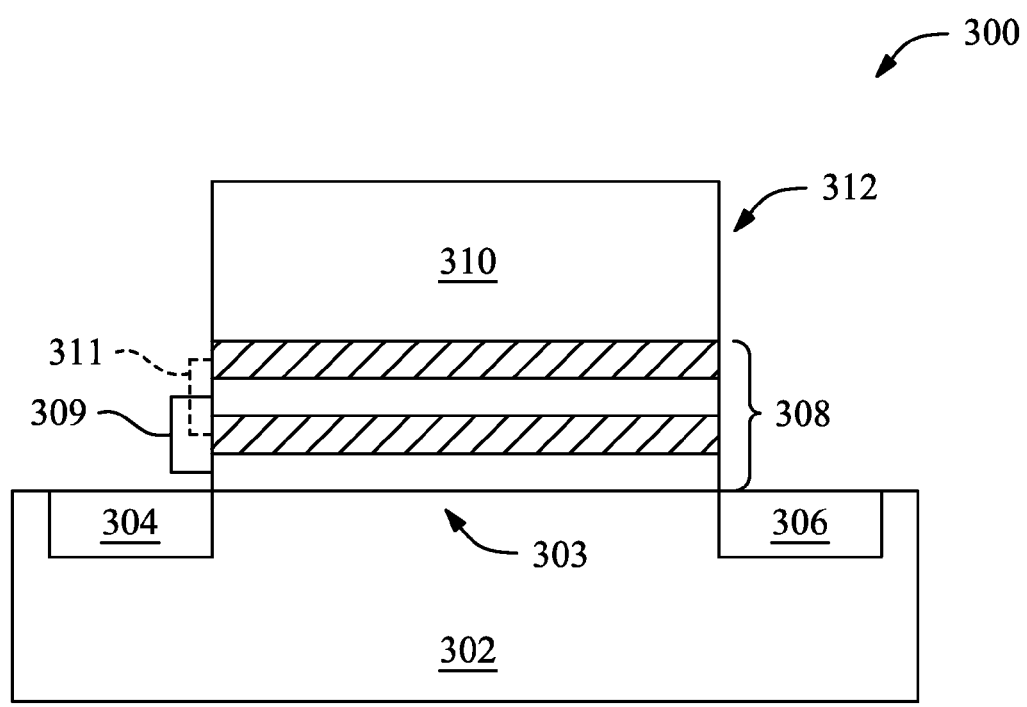
FIG. 3 illustrates a sectional view of an exemplary semiconductor device that includes an aluminum-containing film made by the method of FIG. 1.

FIG. 3 illustrates an embodiment of an exemplary semiconductor device 300 that includes an aluminum-containing composite layer 308 that is formed by using the method 100 with respect to FIG. 3. In the illustrated embodiment of FIG. 3, the semiconductor device 300 includes a semiconductor substrate 302 that includes an active channel region 303, source/drain features 304/306, and a gate stack 312 formed over the active channel region 303. The gate stack 312 includes the aluminum-containing layer composite 308 and a gate electrode 310. In the specific embodiment of FIG. 3, the aluminum-containing composite layer 308 may serve as a gate dielectric layer for the semiconductor device 300, and more particularly, the gate dielectric layer (the aluminum-containing composite layer 308) may further multiple layers as described above. In the illustrated embodiment, the gate dielectric layer 308 includes two aluminum-containing layers 309 and two non-aluminum-containing layers 311. According to the embodiments of the present disclosure, such aluminum-containing composite layer 308 may thus have an aluminum percentage of about 5% atomic ratio and a thickness of about 4 angstroms.

The embodiments of the present disclosure provide a variety of advantages to form an aluminum-containing film. In an example, by sequentially applying/injecting two precursors with substantially different molecule weights into an ALD chamber, a self-limiting layer may be formed with a relatively low percentage of aluminum (e.g., about 10% atomic ratio) while keeping the layer with a thin thickness that is about 1 angstrom. Conventionally, in order to form a layer or a composite layer that has such a low percentage of aluminum, a multi-layer approach may be required to average down a relatively high percentage of aluminum by lamination with layers containing no aluminum. Generally, this may cause the formed composite layer to have a relatively thick thickness, which may disadvantageously arise issues if the composite layer is used as a gate dielectric layer such as, poor gate control ability, scalability, etc.

Thus, the present disclosure provides a method of forming an aluminum-containing film in accordance with some embodiments. The method includes providing a substrate in an atomic layer deposition (ALD) process chamber; and performing a cycle of a first step and a second step one or more times in the ALD process chamber to provide a composite layer, wherein performing the first step of the cycle includes: applying a first precursor that includes a non-aluminum-based component having a first molecular weight onto the substrate; and applying a second precursor that that includes an aluminum-based component having a second molecular weight onto the substrate, wherein the second molecular weight is lower than the first molecular weight; and wherein performing the second step of the cycle includes applying the first precursor onto the substrate.

The present disclosure also provides a method of forming an aluminum-containing film in accordance with some embodiments. The method includes providing a substrate in an atomic layer deposition (ALD) process chamber; injecting a first precursor that includes a first molecule with a first molecular weight into the ALD chamber for a first interval; and injecting a second precursor that includes a second molecule containing aluminum and having a second molecular weight into the ALD chamber for a second interval thereby forming a first aluminum layer on the substrate, wherein the second molecular weight is less than the first molecular weight.

The present disclosure also provides a method of forming an aluminum-containing film in accordance with some embodiments. The method includes providing a substrate in an atomic layer deposition (ALD) process chamber; injecting a first precursor that includes a first molecule with a first molecular weight into the ALD process chamber for a short interval; injecting a second precursor that includes a second molecule containing aluminum and having a second molecular weight into the ALD process chamber for a short interval thereby forming a first aluminum-containing layer on the substrate, wherein the second molecular weight is less than the first molecular weight by about 80%; and injecting the first precursor into the ALD process chamber for a short interval thereby forming a second non-aluminum-containing layer over the first aluminum-containing layer.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method comprising:
providing a substrate in an atomic layer deposition (ALD) process chamber; and
performing a cycle of a first step and a second step one or more times in the ALD process chamber to provide a composite layer,
wherein performing the first step of the cycle includes:
applying an oxygen-based precursor to the substrate to form an oxygen treated surface on the substrate;
after applying the oxygen-based precursor, applying a first precursor that includes a non-aluminum-based component having a first molecular weight onto the substrate such that the non-aluminum-based component is directly bonded to the oxygen treated surface of the substrate; and
after applying the oxygen-based precursor, applying a second precursor that that includes an aluminum-based component having a second molecular weight over the first precursor and the substrate such that the aluminum-based component is directly bonded to the oxygen treated surface of the substrate, wherein the second molecular weight is lower than the first molecular weight; and
wherein performing the second step of the cycle includes applying the first precursor onto the substrate.

2. The method of claim 1, wherein after performing the cycle of the first step and the second step the composite layer has a concentration of aluminum that is about 5% atomic ratio.

3. The method of claim 1, wherein the non-aluminum-based component includes either TetrakisDiMethylAmino-Hafnium (TDMAHf) or TetrakisEthylMethylAmidoZirconium (TEMAZr), and
wherein the aluminum-based component includes TriMethylAluminium (TMAl).

4. The method of claim 1, wherein after performing the first step of the cycle a first layer of the composite layer is formed on the substrate having a concentration of aluminum that is about 10% atomic ratio.

5. The method of claim 4, wherein the first layer of the composite layer includes a thickness that is about 1 angstrom.

6. The method of claim 1, wherein the first molecular weight is greater than the second molecular weight by about 80%.

7. The method of claim 1, wherein performing the first step of the cycle that includes applying the first precursor that includes the non-aluminum-based component having the first molecular weight onto the substrate includes applying the first precursor for a period of about 0.1 seconds to about 2 seconds, and
wherein performing the first step of the cycle that includes applying the second precursor that includes the aluminum-based component having the second molecular weight onto the substrate includes applying the second precursor for a period of about 0.1 seconds to about 0.5 seconds.

8. The method of claim 1, wherein performing the first step of the cycle that includes applying the first precursor that includes the non-aluminum-based component having the first molecular weight onto the substrate includes applying the first precursor at a flow rate of about 100 to about 300 standard cubic centimeters per minute (sccm), and
wherein performing the first step of the cycle that includes applying the second precursor that includes the aluminum-based component having the second molecular weight onto the substrate includes applying the second precursor at a flow rate of about 50 to about 300 sccm.

9. The method of claim 1, wherein the first precursor and the second precursor respectively includes a first size and a second size, and the first size is substantially greater than the second size.

10. The method of claim 1, wherein performing the cycle of the first step and the second step one or more times in the ALD process chamber includes maintaining a temperature of the ALD process chamber in a range of temperature from about 100° C. to about 150° C.

11. A method comprising:
providing a substrate in an atomic layer deposition (ALD) process chamber;
applying an oxygen-based precursor to the substrate to form an oxygen treated surface on the substrate;
after applying the oxygen based precursor, injecting a first precursor that includes a first molecule with a first molecular weight into the ALD chamber for a first interval such that the first molecule bonds directly to the oxygen treated surface of the substrate; and
after applying the oxygen based precursor, injecting a second precursor that includes a second molecule containing aluminum and having a second molecular weight into the ALD chamber for a second interval thereby forming a first aluminum layer on the substrate, wherein the second molecular weight is less than the first molecular weight and the second molecule bonds directly to the oxygen treated surface of the substrate after the injecting of the second precursor.

12. The method of claim 11, further comprising injecting a third precursor into the ALD chamber thereby forming a second layer on the first layer, after forming the first layer on the substrate.

13. The method of claim 12, wherein the third precursor is formed of the same material as the first precursor.

14. The method of claim 11, wherein the percentage of aluminum in the first layer is not greater than 10% atomic ratio and a thickness of the first layer is about 1 angstrom.

15. The method of claim 11, wherein the first precursor includes either TetrakisDiMethylAminoHafnium (TDMAHf) or TetrakisEthylMethylAmidoZirconium (TEMAZr), and
wherein the second precursor includes TriMethylAluminium (TMAl).

16. The method of claim 11, wherein the first molecular weight is greater than the second molecular weight by about 80%.

17. The method of claim 11, wherein injecting the first precursor into the ALD chamber includes flowing the first precursor at a flow rate of about 100 to about 300 standard cubic centimeters per minute (sccm), and wherein injecting the second precursor into the ALD chamber includes flowing the second precursor at a flow rate of about 50 to about 300 sccm.

18. The method of claim 11, wherein injecting the first precursor into the ALD chamber and injecting the second precursor into the ALD chamber includes maintaining temperature of the ALD chamber in a temperature range of about 100° C. to about 150° C.

19. A method comprising:

providing a substrate in an atomic layer deposition (ALD) process chamber;

applying an oxygen-based precursor to the substrate to form an oxygen treated surface on the substrate;

after applying the oxygen based precursor, injecting a first precursor that includes a first molecule with a first molecular weight into the ALD process chamber such that the first molecule bonds directly to the oxygen treated surface of the substrate;

after applying the oxygen based precursor, injecting a second precursor that includes a second molecule containing aluminum and having a second molecular weight into the ALD process chamber thereby forming a first aluminum-containing layer on the substrate, wherein the second molecular weight is less than the first molecular weight by about 80% and the second molecule bonds directly to the oxygen treated surface of the substrate after the injecting of the second precursor; and injecting the first precursor into the ALD process chamber thereby forming a second non-aluminum-containing layer over the first aluminum-containing layer.

20. The method of claim 1, wherein after applying the first precursor and the second precursor a layer is formed having a 2:1 ratio of the non-aluminum-based component to the aluminum-based component.

* * * * *